(12) United States Patent
Ho et al.

(10) Patent No.: US 7,869,276 B2
(45) Date of Patent: Jan. 11, 2011

(54) NAND TYPE MEMORY AND PROGRAMMING METHOD THEREOF

(75) Inventors: Wen-Chiao Ho, Tainan (TW);
Chin-Hung Chang, Tainan (TW);
Kuen-Long Chang, Taipei (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 378 days.

(21) Appl. No.: 11/946,893

(22) Filed: Nov. 29, 2007

(65) Prior Publication Data
US 2009/0154233 A1    Jun. 18, 2009

(51) Int. Cl.
*G11C 16/06* (2006.01)
*G11C 16/10* (2006.01)
*G11C 16/22* (2006.01)

(52) U.S. Cl. .............................. 365/185.09; 365/185.02; 365/185.03; 365/185.08; 365/185.17; 365/185.24; 365/185.25

(58) Field of Classification Search ............ 365/185.02, 365/185.03, 185.08, 185.09, 185.17, 185.24, 365/185.25
See application file for complete search history.

(56) References Cited

U.S. PATENT DOCUMENTS

| 2002/0126531 A1* | 9/2002 | Hosono et al. | 365/185.17 |
| 2003/0016562 A1* | 1/2003 | Im | 365/189.02 |
| 2010/0027339 A1* | 2/2010 | Ho et al. | 365/185.12 |

* cited by examiner

*Primary Examiner*—J. H. Hur
(74) *Attorney, Agent, or Firm*—Thomas, Kayden, Horstemeyer & Risley

(57) ABSTRACT

A memory includes many memory regions. The memory regions have multiple multi-level cells. Each memory region includes a first bit line, a second bit line, a data buffer and a protecting unit. The first bit line is coupled to a first column of the multi-level cells. The second bit line is coupled to a second column of the multi-level cells. The data buffer is coupled to the first bit line and the second bit line and for storing data to be programmed into the multi-level cells. The protecting unit is coupled to the first bit line, the second bit line and the data buffer and is for preventing a programming error from occurring.

12 Claims, 4 Drawing Sheets

NAND TYPE MEMORY AND PROGRAMMING METHOD THEREOF

BACKGROUND OF THE INVENTION

1. Field of the Invention

The invention relates in general to a memory and a programming method thereof, and more particularly to a memory having the better overall behavior, and a programming method thereof.

2. Description of the Related Art

NAND type memories are widely used in various data storage applications. The NAND type memories may be classified into various types including, for example, a multi-level cell (MLC) NAND type memory. FIG. 1 (Prior Art) is a schematic illustration showing threshold voltage distributions of a multi-level cell NAND type memory. Threshold voltage distributions A to D are usually defined as those sequentially corresponding to 11, 10, 00, 01. Each threshold voltage distribution in FIG. 1 has to be converged so that a sufficient read window may be kept.

The MLC NAND type memory has many multi-level cells. Before the multi-level cells are programmed, threshold voltages of these multi-level cells pertain to the threshold voltage distribution A. When the multi-level cell NAND type memory is being programmed, a threshold voltage of the multi-level cell to be programmed into "10" is programmed from the threshold voltage distribution A to the threshold voltage distribution B. Then, a programming verification process is performed according to a programming verification voltage PV1. Next, the threshold voltage of the multi-level cell to be programmed into "00" is programmed from the threshold voltage distribution A to the threshold voltage distribution C, and then the programming verification process is performed according to a programming verification voltage PV2. Thereafter, the threshold voltage of the multi-level cell to be programmed into "01" is programmed from the threshold voltage distribution A to the threshold voltage distribution D, and then the programming verification process is performed according to a programming verification voltage PV3.

However, during the process of programming the threshold voltage of the multi-level cell from the threshold voltage distribution A into the threshold voltage distribution B, some of the multi-level cells to be programmed into the threshold voltage distribution C may be programmed into the threshold voltage distribution B in advance based on the prior art architecture. However, no programming verification process is performed on these multi-level cells according to the programming verification voltage PV1. Consequently, during the process of programming the threshold voltage of the multi-level cell from the threshold voltage distribution A into the threshold voltage distribution C, the threshold voltages of these multi-level cells are too high so that an error occurs when the multi-level cell is being read according to read voltages RD1/RD2/RD3.

Similarly, similar conditions also occur when the threshold voltage of the multi-level cell is programmed from the threshold voltage distribution A into the threshold voltage distribution C. Some of the multi-level cells to be programmed into the threshold voltage distribution D may be programmed. Thus, it is an important direction to be tried in the industry to correctly program the multi-level cell without generating the too-high threshold voltage.

SUMMARY OF THE INVENTION

The invention is directed to a memory and a programming method thereof, wherein the overall efficiency of the memory is enhanced by performing programming and programming verification processes for each phase according to the same operations.

According to a first aspect of the present invention, a memory including many memory regions is provided. The memory regions have multiple multi-level cells. Each memory region includes a first bit line, a second bit line, a data buffer and a protecting unit. The first bit line is coupled to a first column of the multi-level cells. The second bit line is coupled to a second column of the multi-level cells. The data buffer is coupled to the first bit line and the second bit line and is for storing data to be programmed into the multi-level cells. The protecting unit is coupled to the first bit line, the second bit line and the data buffer, and is for preventing a programming error from occurring.

According to a second aspect of the present invention, a method of programming a memory is provided. The memory includes many memory regions. Each memory region includes a first bit line, a second bit line, a data buffer and a protecting unit. The first bit line is coupled to a first column of multi-level cells, and the second bit line is coupled to a second column of multi-level cells. The data buffer is coupled to the first bit line and the second bit line and is for storing data to be programmed into the multi-level cells. The protecting unit is coupled to the first bit line, the second bit line and the data buffer, and is for preventing a programming error from occurring. The programming method includes the following steps. First, corresponding data is respectively inputted to the data buffers. Next, the data corresponding to the $n^{th}$ phase is programmed into the targeted multi-level cells, wherein n is a positive integer. Then, it is judged whether the targeted multi-level cells pass a programming verification process or not according to an $n^{th}$ programming verification voltage. Next, data corresponding to an $(n+1)^{th}$ phase is modified to make the data corresponding to the $(n+1)^{th}$ phase be the same as the data corresponding to the $n^{th}$ phase if the targeted multi-level cells pass the programming verification process. Then, steps (b) to (d) are repeated until n is equal to a maximum, wherein the step (d) is not performed when n is equal to the maximum. Programming operations of each of the phases are the same.

The invention will become apparent from the following detailed description of the preferred but non-limiting embodiments. The following description is made with reference to the accompanying drawings.

DETAILED DESCRIPTION OF THE INVENTION

Figure 1:
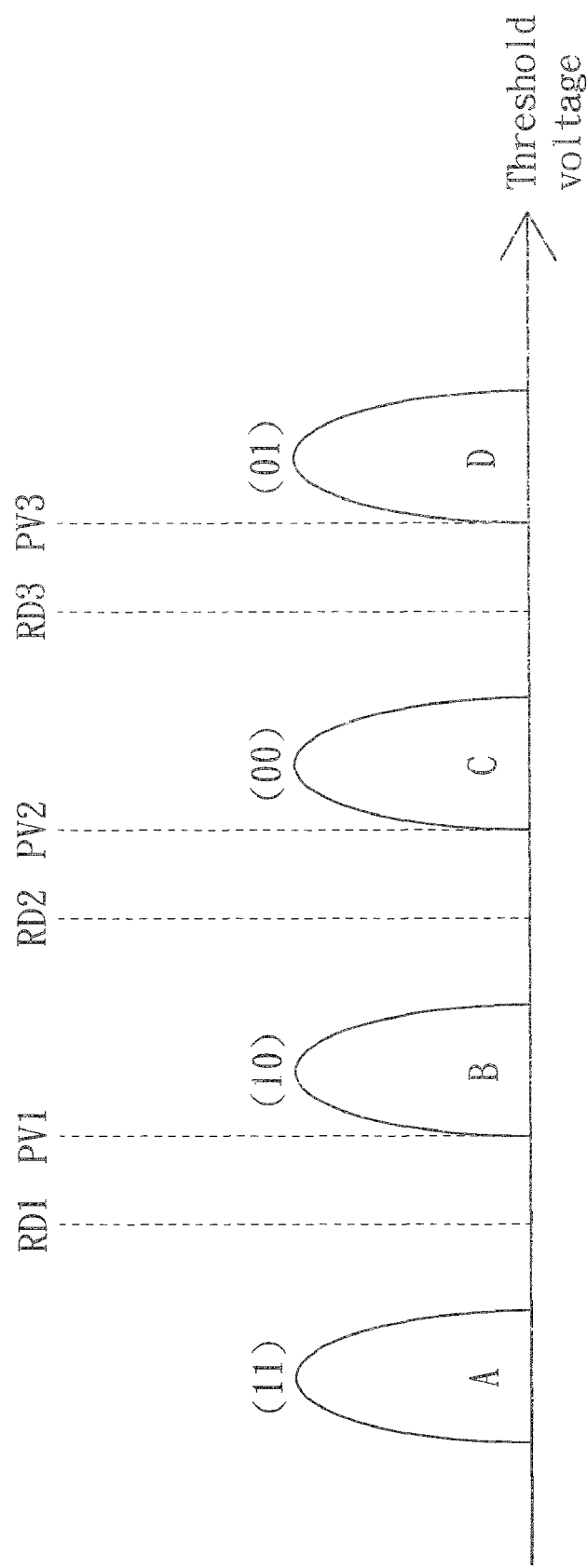
FIG. 1 (Prior Art) is a schematic illustration showing threshold voltage distributions of a multi-level cell NAND type memory.
Figure 2:
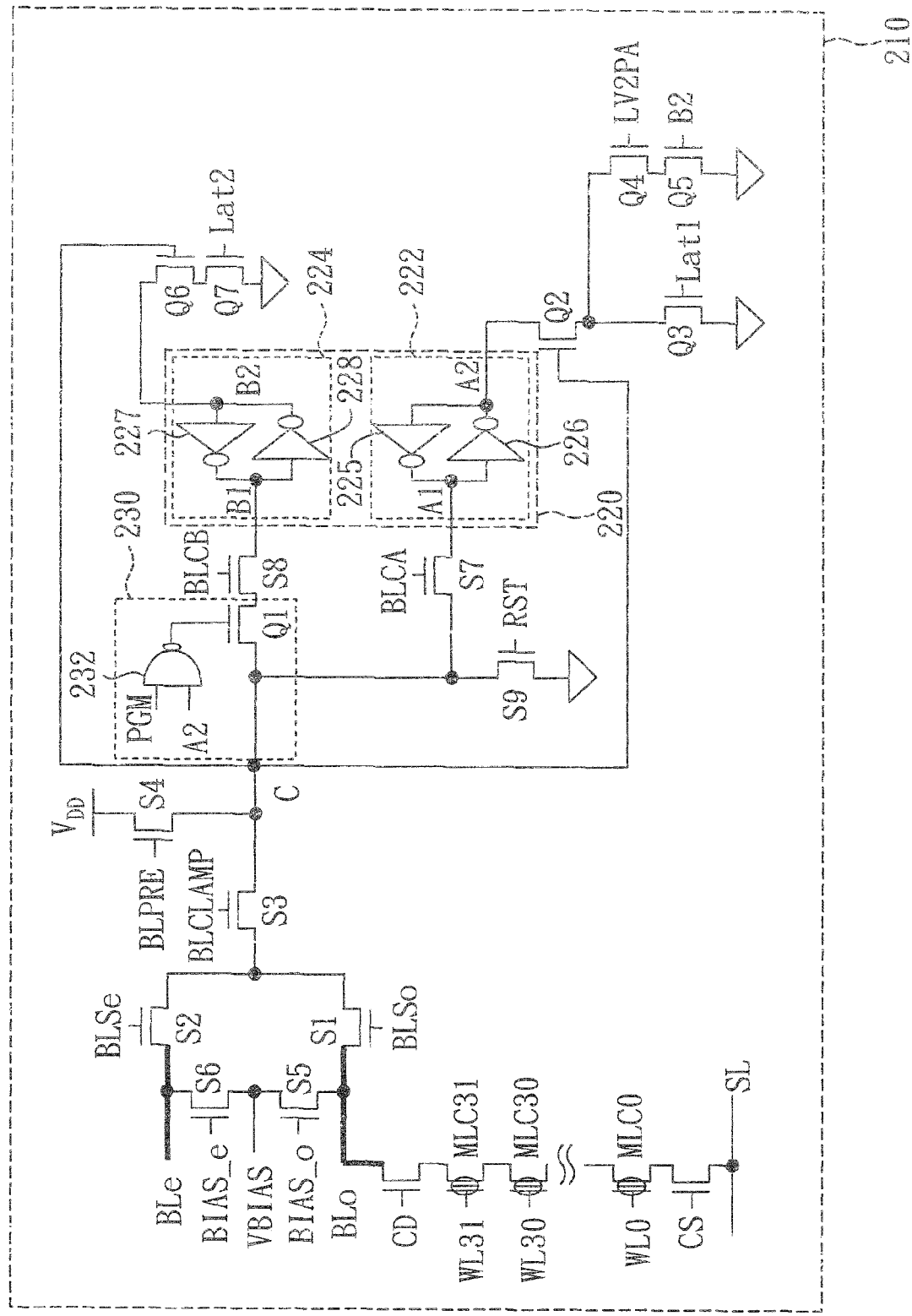
FIG. 2 is a partial circuit diagram showing a NAND type memory according to a preferred embodiment of the invention.

The memory disclosed hereinafter in the invention is exemplified by a NAND type memory, but it is not limited thereto. FIG. 2 is a partial circuit diagram showing a NAND type memory 200 according to a preferred embodiment of the invention. Referring to FIG. 2, the NAND type memory 200 includes many memory regions 210 each including a first bit line BLo, a second bit line BLe, a data buffer 220 and a protecting unit 230. The first bit line BLo is coupled to a first column of multi-level cells, such as MLC0 to MLC31, and the second bit line BLe is coupled to a second column of multi-level cells (not shown). The data buffer 220 is coupled to the first bit line BLo and the second bit line BLe and is for storing data to be programmed into the multi-level cells. The protecting unit 230 is coupled to the first bit line BLo, the second bit line BLe and the data buffer 220 and is for preventing a programming error from occurring.

The memory region 210 further includes a first selection transistor S1, a second selection transistor S2, a clamp transistor S3 and a pre-charge transistor S4. The first selection transistor S1 is coupled to the first bit line BLo and is for selecting the first bit line BLo to write the data stored in the data buffer 220 to the first column of multi-level cells. The second selection transistor S2 is coupled to the second bit line BLe and is for selecting the second bit line BLe to write the data stored in the data buffer 220 to the second column of multi-level cells. The first terminal of the clamp transistor S3 is coupled to the first selection transistor S1 and the second selection transistor S2. The first terminal of the pre-charge transistor S4 receives an operation voltage $V_{DD}$, and the second terminal of the pre-charge transistor S4 is coupled to the second terminal of the clamp transistor S3.

The memory region 210 further includes a first bias switch S5 and a second bias switch S6. The first bias switch S5 is controlled by a first bias signal BIAS_o, the first terminal of the first bias switch S5 is coupled to the first bit line BLo, and the second terminal of the first bias switch S5 receives a bias voltage VBIAS. The second bias switch S6 is controlled by a second bias signal BIAS_e, the first terminal of the second bias switch S6 is coupled to the second bit line BLe, and the second terminal of the second bias switch S6 receives the bias voltage VBIAS.

The data buffer 220 is coupled to the protecting unit 230 and includes a first latch 222 and a second latch 224. The first latch 222 is for storing first bit data to be programmed into the multi-level cells. The first latch 222 includes a first inverter 225 and a second inverter 226. The output terminal (i.e., node A1) of the first inverter 225 outputs the first bit data and is coupled to the input terminal of the second inverter 226. The input terminal (i.e., node A2) of the first inverter 225 is coupled to the output terminal of the second inverter 226. The second latch 224 stores second bit data to be programmed into the multi-level cells and includes a third inverter 227 and a fourth inverter 228. The output terminal (i.e., node B1) of the third inverter 227 outputs the second bit data, and is coupled to the input terminal of the fourth inverter 228, and the input terminal (i.e., node B2) of the third inverter 227 is coupled to the output terminal of the fourth inverter 228.

The protecting unit 230 is coupled to the clamp transistor S3 and the data buffer 220, and includes a NAND gate 232 and a first switch Q1. The first input terminal of the NAND gate 232 receives a programming signal PGM, and the second input terminal of the NAND gate 232 is coupled to the output terminal (i.e., node A2) of the second inverter 226. The first switch Q1 is controlled by the NAND gate 232, the first terminal of the first switch Q1 is coupled to the output terminal of the first inverter 225, and the second terminal of the first switch Q1 is coupled to the output terminal of the third inverter 227.

The memory region 210 further includes a first selection switch S7, a second selection switch S8 and a reset switch S9. The first terminal of the first selection switch S7 is coupled to the output terminal of the first inverter 225, and the second terminal of the first selection switch S7 is coupled to the second terminal of the first switch Q1. The first terminal of the second selection switch S8 is coupled to the output terminal of the third inverter 227, and the second terminal of the second selection switch S8 is coupled to the first terminal of the first switch Q1. The first terminal of the reset switch S9 is coupled to the second terminal of the first selection switch S7, and the second terminal of the reset switch S9 receives a ground voltage.

The memory region 210 further includes a second switch Q2, a third switch Q3, a fourth switch Q4, a fifth switch Q5, a sixth switch Q6 and a seventh switch Q7. The first terminal of the second switch Q2 is coupled to the input terminal of the first inverter 225, and the control terminal of the second switch Q2 is coupled to the second terminal (i.e., node C) of the clamp transistor S3. The first terminal of the third switch Q3 is coupled to the second terminal of the second switch Q2, and the second terminal of the third switch Q3 receives the ground voltage. The first terminal of the fourth switch Q4 is coupled to the second terminal of the second switch Q2 and the fourth switch Q4 turns on each time when programming ends.

The first terminal of the fifth switch Q5 is coupled to the second terminal of the fourth switch Q4, the second terminal of the fifth switch Q5 receives the ground voltage, and the control terminal of the fifth switch Q5 is coupled to the input terminal (i.e., node B2) of the third inverter 227. The first terminal of the sixth switch Q6 is coupled to the input terminal of the third inverter 227, and the control terminal of the sixth switch Q6 is coupled to the second terminal of the clamp transistor S3. The first terminal of the seventh switch Q7 is coupled to the second terminal of the sixth switch Q6, and the second terminal of the seventh switch Q7 receives the ground voltage.

Figure 3:
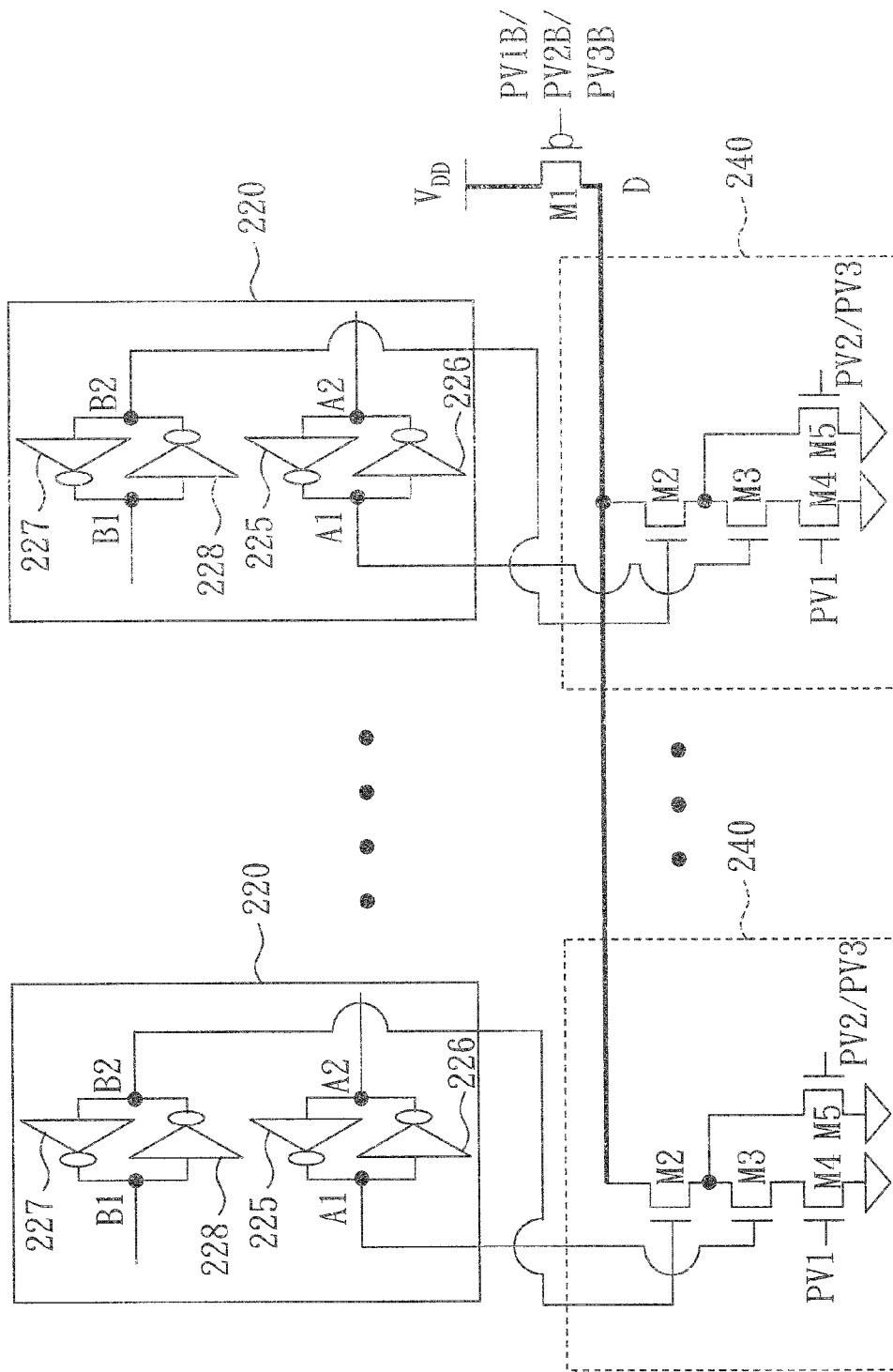
FIG. 3 is another partial circuit diagram showing the NAND type memory according to the preferred embodiment of the invention.

FIG. 3 is another partial circuit diagram showing the NAND type memory according to the preferred embodiment of the invention. Referring to FIG. 3, the NAND type memory 200 further includes a first transistor M1 and many judging units 240. The first terminal of the first transistor M1 receives the operation voltage $V_{DD}$, and the first transistor M1 is controlled by an inverse programming verification voltage PV1B/PV2B/PV3B. The judging units 240 respectively correspond to the data buffer 220, and each judging unit 240 includes a second transistor M2, a third transistor M3, a fourth transistor M4 and a fifth transistor M5. The first terminal of the second transistor M2 is coupled to the second terminal (node D) of the first transistor M1, and the control terminal of the second transistor M2 is coupled to the input terminal (i.e., node B2) of the third inverter 227.

The first terminal of the third transistor M3 is coupled to the second terminal of the second transistor M2, and the control terminal of the third transistor M3 is coupled to the output terminal (i.e., node A1) of the first inverter 225. The first terminal of the fourth transistor M4 is coupled to the second terminal of the third transistor M3, the second terminal of the fourth transistor M4 receives the ground voltage, and the fourth transistor M4 is controlled by a first programming verification voltage PV1. The first terminal of the fifth transistor M5 is coupled to the second terminal of the second transistor M2, the second terminal of the fifth transistor M5 receives the ground voltage, and the fifth transistor M5 is controlled by a second programming verification voltage PV2 or a third programming verification voltage PV3.

The process of programming the threshold voltage of the multi-level cell, which is to be programmed into "10", from the threshold voltage distribution A into the threshold voltage distribution B is defined as a first phase. The process of programming the threshold voltage of the multi-level cell, which is to be programmed into "00", from the threshold voltage distribution A into the threshold voltage distribution C is defined as a second phase. The process of programming the threshold voltage of the multi-level cell, which is to be programmed into "01", from the threshold voltage distribution A into the threshold voltage distribution D is defined as a third phase.

In the first phase, the threshold voltage of the multi-level cell to be programmed into "10" is programmed from the threshold voltage distribution A to the threshold voltage distribution B. First, the first bit data "1" and the second bit data "0" are respectively written into the first latch 222 and the second latch 224 through an additional transmission path. That is, the state of the node A1 corresponds to the first bit data "1", and the state of the node B1 corresponds to the second bit data "0". In addition, the first bias switch S5 and the second bias switch S6 turn on, and the first bit line BLo and the second bit line BLe are pre-charged to the bias voltage VBIAS, wherein the bias voltage VBIAS is the operation voltage $V_{DD}$, for example. Thereafter, the first bias switch S5 and the second bias switch S6 turn off.

If the multi-level cell to be programmed into "10" is one of the first column of multi-level cells MLC0 to MLC31, the first selection transistor S1, the clamp transistor S3 and the second selection switch S8 turn on, and the second bit data stored in the second latch 224 is written into the multi-level cells of the target. At this time, the state of the node A1 corresponds to the first bit data "1", so the state of the node A2 corresponds to the data "0", the output terminal of the NAND gate 232 outputs the operational voltage VDD, and the first switch Q1 turns on. Relatively, if the state of the node A2 of the multi-level cell to be programmed into "00" corresponds to the data "1", the output terminal of the NAND gate 232 outputs the ground voltage, and the first switch Q1 turns off. So, the protecting unit 230 can prevent the multi-level cell to be programmed into "00" from being programmed in the first phase.

After the first phase, the programming verification process has to be performed on the targeted multi-level cells according to the first programming verification voltage PV1. The pre-charge transistor S4 and the clamp transistor S3 turn on, the voltage level of the node C is the operation voltage $V_{DD}$. If the threshold voltage of the targeted multi-level cell has been programmed from the threshold voltage distribution A into the threshold voltage distribution B, the voltage level of the node C is held at the operation voltage $V_{DD}$, the sixth switch Q6 and the seventh switch Q7 turn on, and the voltage level of the node B2 turns into the ground voltage through the sixth switch Q6 and the seventh switch Q7. So, judging the voltage level of the node B2 can obtain whether the programming verification process of the first phase can pass or not. If the voltage level of the node B2 is the operation voltage $V_{DD}$, the programming verification process of the first phase does not pass. If the voltage level of the node B2 is the ground voltage, the programming verification process of the first phase passes.

In the NAND type memory 200, the voltage level of the node B2 is judged according to the first transistor M1 and the judging unit 240. During the programming verification process of the first phase, the first transistor M1 is turned on for a suitable time by signal PV1B so as to pre-charge the node D to the operational voltage $V_{DD}$ level. After the node D is charged to the operational voltage $V_{DD}$, if all the targeted multi-level cells have passed the programming verification process of the first phase, the voltage level of the node B2 is the ground voltage, and the second transistor M2 turns off. So, the voltage level of the node D is kept at the operation voltage $V_{DD}$. If one multi-level cell does not pass the programming verification process of the first phase, the voltage level of the corresponding node B2 is the operation voltage $V_{DD}$, and the second transistor M2 turns on. At this time, the third transistor M3 and the fourth transistor M4 also turn on, and the voltage level of the node D turns into the ground voltage.

Thereafter, the threshold voltage of the multi-level cell to be programmed into "00" is programmed from the threshold voltage distribution A into the threshold voltage distribution C in the second phase. After the programming verification process of the first phase is finished, the original data being to be programmed to the threshold voltage distribution B will changed to the state that, the state of the node A1 corresponds to the data "1," and the state of the node B1 also corresponds to the data "1" so that the states are the same as those in the first phase. Before the programming process of the second phase begins, a data change operation will be done first. The first bit data "0" in the node A1 of the first latch 222 and the second bit data "0" in the node B1 of the second latch 224 will changed to the condition that the first bit data being modified to "1" by a rising pulse signal LV2PA, meanwhile, the second bit data being kept "0". In more detail, the fourth switch Q4 and the fifth switch Q5 will turn on and discharge the node A2 to ground level, that means the first bit data in the node A1 will be changed to "1". During the second phase, the data corresponds to the threshold voltage distribution D will not be changed since the corresponding node B2 is at the ground voltage. After the data change operation, the data remained will be "11", "10", and "01", which the data "10" is modified from original data "00". Consequently, the programming and programming verification processes of the NAND type memory 200 in the second phase are also the same as those in the first phase except that the first programming verification voltage PV1 is replaced with the second programming verification voltage PV2

Thereafter, the threshold voltage of the multi-level cell to be programmed into "01" is programmed from the threshold voltage distribution A into the threshold voltage distribution D in the third phase. The first bit data "0" and the second bit data "1" are respectively written into the first latch 222 and the second latch 224 through the additional transmission path. However, after the programming verification process of the second phase is finished, the state of the node A1 corresponds to the data "1", and the state of the node B1 also corresponds to the data "1" so that the states are the same as those before the second phase. In order to make the operation process of the NAND type memory 200 in the third phase be the same as that in the second phase, the voltage level of the programming signal PGM is transformed into the ground voltage level, and the first selection switch S7 and the second selection switch S8 turn on to transmit the first bit data "0" stored in the first latch 222 to the second latch 224. Consequently, the programming and programming verification processes of the NAND type memory 200 in the third phase are the same as those in the second phase except that the second programming verification voltage PV2 is replaced with the third programming verification voltage PV3.

The invention also provides a programming method of a memory. The memory includes many memory regions each including a first bit line, a second bit line, a data buffer and a protecting unit. The first bit line is coupled to a first column of multi-level cells, and the second bit line is coupled to a second column of multi-level cells. The data buffer is coupled to the first bit line and the second bit line and is for storing data to be programmed into the multi-level cells. The protecting unit is coupled to the first bit line, the second bit line and the data buffer and is for preventing a programming error from occurring. The memory is, for example, a NAND type memory.

Figure 4:
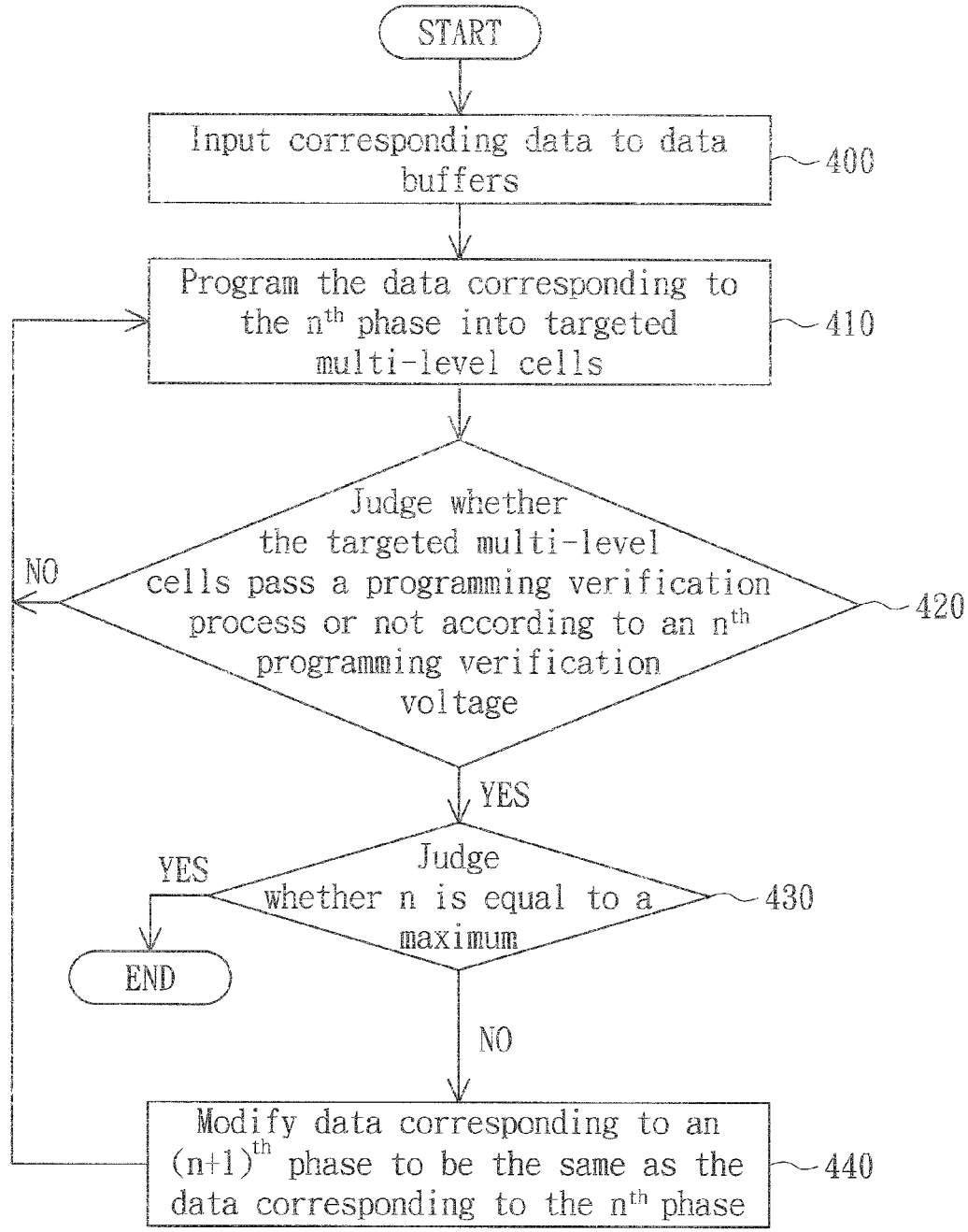
FIG. 4 is a flow chart showing a programming method of the NAND type memory according to the preferred embodiment of the invention.

FIG. 4 is a flow chart showing a programming method of the memory according to the preferred embodiment of the invention. First, corresponding data is respectively inputted to all the data buffers in step 400. Then, in step 410, the data corresponding to the $n^{th}$ phase is programmed into targeted multi-level cells, wherein n is, for example, 1, 2 or 3. Next, in step 420, it is judged whether the targeted multi-level cells pass a programming verification process or not according to an $n^{th}$ programming verification voltage. If not, the process goes back to the step 410, a further programming operation is executed. Next, in step 430, it is judged whether n is equal to the maximum 3 or not. If n is equal to 3, programming of the memory is finished.

If n is not equal to 3, data corresponding to an $(n+1)^{th}$ phase is modified in step 440 so that the data corresponding to the $(n+1)^{th}$ phase is the same as the data corresponding to the $n^{th}$ phase, and then the process goes back to the step 410. Consequently, the programming operations of each of the phases are the same.

According to the memory and the programming method thereof disclosed in the embodiment of the invention, the data corresponding to the $(n+1)^{th}$ phase in the data buffer is modified to make it the same as the data corresponding to the $n^{th}$ phase. Besides, the protecting unit is further utilized for preventing a programming error from occurring. Consequently, the programming and programming verification processes of the memory in various phases will be the same and the threshold voltages of the multi-level cells are not programmed too high, so that the overall behavior of the memory is enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising
a plurality of memory regions having a plurality of multi-level cells, each memory region comprising:
   a first bit line coupled to a first column of the multi-level cells;
   a second bit line coupled to a second column of the multi-level cells;
   a data buffer, coupled to the first bit line and the second bit line, for storing data to be programmed into the multi-level cells; and
   a protecting unit, coupled to the first bit line, the second bit line and the data buffer, for preventing a programming error, wherein the protecting unit, in response to the programming error, decouples the data buffer from the first bit line and the second bit line.

2. The memory according to claim 1, wherein each of the memory regions further comprises:
   a first selection transistor and a second selection transistor for respectively selecting the first bit line and the second bit line;
   a clamp transistor having a first terminal coupled to the first selection transistor and the second selection transistor; and
   a pre-charge transistor having a first terminal for receiving an operation voltage and a second terminal coupled to a second terminal of the clamp transistor.

3. The memory according to claim 2, wherein the data buffer is coupled to the protecting unit, and the data buffer comprises:
   a first latch for storing first bit data to be programmed into the multi-level cells; and
   a second latch for storing second bit data to be programmed into the multi-level cells.

4. The memory according to claim 3, wherein:
   the first latch comprises a first inverter and a second inverter, wherein an output terminal of the first inverter is for outputting the first bit data and is coupled to an input terminal of the second inverter, and an input terminal of the first inverter is coupled to an output terminal of the second inverter; and
   the second latch comprises a third inverter and a fourth inverter, wherein an output terminal of the third inverter is for outputting the second bit data and is coupled to an input terminal of the fourth inverter, and an input terminal of the third inverter is coupled to an output terminal of the fourth inverter.

5. The memory according to claim 4, wherein the protecting unit is coupled to and between the clamp transistor and the data buffer, and the protecting unit comprises:
   a NAND gate having a first input terminal for receiving a programming signal, and a second input terminal coupled to the output terminal of the second inverter; and
   a first switch, which is controlled by the NAND gate and has a first terminal coupled to the output terminal of the first inverter, and a second terminal coupled to the output terminal of the third inverter.

6. The memory according to claim 5, wherein each of the memory regions further comprises:
   a second switch having a first terminal coupled to the input terminal of the first inverter, and a control terminal coupled to the second terminal of the clamp transistor;
   a third switch having a first terminal coupled to a second terminal of the second switch, and a second terminal for receiving a ground voltage;
   a fourth switch, which has a first terminal coupled to the second terminal of the second switch, and turns on when programming ends;
   a fifth switch having a first terminal coupled to a second terminal of the fourth switch, a second terminal for receiving the ground voltage, and a control terminal coupled to the input terminal of the third inverter;
   a sixth switch having a first terminal coupled to the input terminal of the third inverter, and a control terminal coupled to the second terminal of the clamp transistor; and
   a seventh switch having a first terminal coupled to a second terminal of the sixth switch, and a second terminal for receiving the ground voltage.

7. The memory according to claim 5, further comprising:
   a first transistor, which has a first terminal for receiving the operation voltage, and is controlled by an inverse programming verification voltage; and
   a plurality of judging units respectively corresponding to the data buffers, each of the judging units comprising:

a second transistor having a first terminal coupled to a second terminal of the first transistor, and a control terminal coupled to the input terminal of the third inverter;

a third transistor having a first terminal coupled to a second terminal of the second transistor, and a control terminal coupled to the output terminal of the first inverter;

a fourth transistor, which is controlled by a first programming verification voltage and has a first terminal coupled to a second terminal of the third transistor, and a second terminal for receiving the ground voltage; and a fifth transistor, which is controlled by a second programming verification voltage or a third programming verification voltage, and has a first terminal coupled to the second terminal of the second transistor, and a second terminal for receiving the ground voltage.

8. The memory according to claim 5, further comprising:

a first selection switch having a first terminal coupled to the output terminal of the first inverter, and a second terminal coupled to the second terminal of the first switch;

a second selection switch having a first terminal coupled to the output terminal of the third inverter, and a second terminal coupled to the first terminal of the first switch; and a reset switch having a first terminal coupled to the second terminal of the first selection switch, and a second terminal for receiving the ground voltage.

9. The memory according to claim 3, the protecting unit comprising a first switching device selectively coupled between the clamp transistor and the second latch, wherein the first switching device, in response to the programming error, decouples the second latch from the clamp transistor.

10. The memory according to claim 1, wherein each of the memory regions further comprises:

a first bias switch, which is controlled by a first bias signal and has a first terminal coupled to the first bit line and a second terminal for receiving a bias voltage; and a second bias switch, which is controlled by a second bias signal and has a first terminal coupled to the second bit line, and a second terminal for receiving the bias voltage.

11. A memory, comprising a plurality of memory regions having a plurality of multi-level cells, each memory region comprising:

a first bit line coupled to a first column of the multi-level cells;

a second bit line coupled to a second column of the multi-level cells;

a data buffer, coupled to the first bit line and the second bit line, for storing data to be programmed into the multi-level cells, the data buffer comprising: a first latch and a second latch; and a protecting unit, coupled to the first bit line, the second bit line and the data buffer, wherein the protecting unit, in response to an error of the data of the data buffer, decouples the second latch from the first bit line and the second bit line.

12. A memory, comprising a plurality of memory regions having a plurality of multi-level cells, each memory region comprising:

a first bit line coupled to a first column of the multi-level cells;

a second bit line coupled to a second column of the multi-level cells;

a data buffer, coupled to the first bit line and the second bit line, for storing data to be programmed into the multi-level cells; and a protecting unit, coupled to the first bit line, the second bit line and the data buffer, for preventing a programming error, wherein the protecting unit has a NAND gate and a switch.

* * * * *